(12) United States Patent
Han et al.

(10) Patent No.: US 7,042,022 B2
(45) Date of Patent: May 9, 2006

(54) CHIP LIGHT EMITTING DIODE AND FABRICATION METHOD THEREOF

(75) Inventors: Kwan-Young Han, Seoul (KR); Do-Hyung Kim, Suwon (KR); Seung-Man Yang, Seoul (KR); Chung-Hoon Lee, Seoul (KR); Hong-San Kim, Seongnam (KR); Kwang-Il Park, Seoul (KR)

(73) Assignee: Seoul Semiconductor Co., Ltd., (KR)

( * ) Notice: Subject to any disclaimer, the term of this patent is extended or adjusted under 35 U.S.C. 154(b) by 0 days.

(21) Appl. No.: 10/754,389

(22) Filed: Jan. 9, 2004

(65) Prior Publication Data

US 2005/0017259 A1 Jan. 27, 2005

(30) Foreign Application Priority Data

Jul. 25, 2003 (KR) .................. 10-2003-0051365
Aug. 19, 2003 (KR) .................. 10-2003-0057331
Aug. 20, 2003 (KR) .................. 10-2003-0057625

(51) Int. Cl.
    *H01L 29/22* (2006.01)
(52) U.S. Cl. .................. 257/99; 257/100; 257/433
(58) Field of Classification Search ............ 257/91–93, 257/99–101, 433; 438/22
    See application file for complete search history.

(56) References Cited

U.S. PATENT DOCUMENTS

| | | | | |
|---|---|---|---|---|
| 6,608,334 B1* | 8/2003 | Ishinaga | ............... | 257/100 |
| 6,746,295 B1* | 6/2004 | Sorg | ............... | 445/24 |
| 6,774,405 B1* | 8/2004 | Yasukawa et al. | ............... | 257/99 |
| 2002/0113245 A1* | 8/2002 | Lin | ............... | 257/99 |
| 2004/0070001 A1* | 4/2004 | Lee et al. | ............... | 257/99 |
| 2005/0082561 A1* | 4/2005 | Suehiro et al. | ............... | 257/99 |
| 2005/0110035 A1* | 5/2005 | Chen | ............... | 257/99 |

* cited by examiner

*Primary Examiner*—Hoai Pham
*Assistant Examiner*—Nathan W. Ha
(74) *Attorney, Agent, or Firm*—Cantor Colburn LLP

(57) ABSTRACT

A chip light emitting diode having a wide viewing angle, and a fabrication method thereof. The chip light emitting diode has a resin package sealing a light emitting chip which has at least one curved projecting part. The curved projecting part has a cross section which is substantially semicircular, or substantially or partially elliptical or parabolic. The curved projecting part preferably has a cross section which is comprised of a plurality of straight lines, an angle being formed between adjacent lines. The cross section is elongated to form a cylindrical outer surface of the resin package.

6 Claims, 9 Drawing Sheets

CHIP LIGHT EMITTING DIODE AND FABRICATION METHOD THEREOF

BACKGROUND OF THE INVENTION (a) Field of the Invention

The present invention relates to a chip light emitting diode and a fabrication method thereof.

(b) Description of the Related Art

Chip light emitting diodes (LEDs) are generally employed as display devices and for backlighting. Recently, their use range has been increased to include various applications such as light sources for mobile phones and personal digital assistants (PDAs).

Referring to FIG. 1, a conventional chip LED 50 is provided with a metal pad 52 and a lead 55 on a printed circuit board (PCB) 51. A light emitting chip 53 mounted on the metal pad 52 is connected to the lead 55 via a wire 54. A resin package 56 is formed of an epoxy mold compound (EMC), and seals the chip 53.

The conventional chip LED 50 has drawbacks in that optical paths of emitted light rays are limited because the resin package 56 has a rectangular cross section, causing a narrow viewing angle of the chip LED. Further, the intensity distribution of the emitted light is concentrated at the position of the chip. Therefore, many chip LEDs are required to light a certain area, resulting in high manufacturing cost in some applications such as for backlighting.

Further, heat generated from the conventional chip LED 50 during operation is concentrated in the edges, resulting in thermal or mechanical deformation of the diode.

When the thickness of the resin package is reduced for overall compactness of the conventional chip LED, a metal mold of the resin package should be more precisely formed for the edges, which may result in high manufacturing costs. Further, when the thickness of the resin package happens to be not uniform, stress may be concentrated at a thin part, so the adhesive strength is deteriorated causing poor reliability of the chip LED.

SUMMARY OF THE INVENTION

In view of the prior art described above, it is an object of the present invention to provide a chip light emitting diode (LED) having a wide viewing angle and a fabrication method thereof.

It is another object of the present invention to provide a chip LED in which the light intensity is substantially uniform on either side in order to illuminate a larger area with high brightness.

It is another object of the present invention to provide a chip LED in which the heat generated is distributed uniformly to avoid thermal and mechanical deformation and to prevent stress from centralizing on one side.

It is still another object of the present invention to provide a fabrication method of a chip LED, in which a simple metal mold structure can be employed to reduce fabrication costs.

To achieve these and other objects, as embodied and broadly described herein, a chip light emitting diode includes:

a metal pad and a lead spaced away from each other on a printed circuit board;

a light emitting chip mounted on the metal pad;

a wire connecting the light emitting chip and the lead; and a resin package sealing the light emitting chip and at least a part of the metal pad, the lead, and the wire, the resin package having at least one curved projecting part.

The curved projecting part has a cross section which is substantially semicircular, or substantially or partially elliptical or parabolic. The curved projecting part preferably has a cross section which is comprised of a plurality of straight lines, an angle being formed between adjacent lines.

According to another aspect of the present invention, a fabrication method of a chip light emitting diode comprises the steps of:

mounting a light emitting chip on a metal pad formed on a printed circuit board;

connecting the light emitting chip to a lead formed on the printed circuit board;

providing the printed circuit board within a mold having a cavity, the cavity corresponding to at least one projecting part of the chip light emitting diode; and forming a resin package sealing the light emitting chip and at least a part of the metal pad and lead by injecting resin material into the cavity of the mold, the resin package having at least one curved projecting part.

Both the foregoing general description and the following Detailed Description are exemplary and are intended to provide further explanation of the invention as claimed.

BRIEF DESCRIPTION OF THE DRAWINGS

The accompanying drawings provide a further understanding of the invention and, together with the Detailed Description, explain the principles of the invention. In the drawings.

DETAILED DESCRIPTION OF THE PREFERRED EMBODIMENTS

The present invention will be described in detail with reference to the accompanying drawings.

Figure 2:
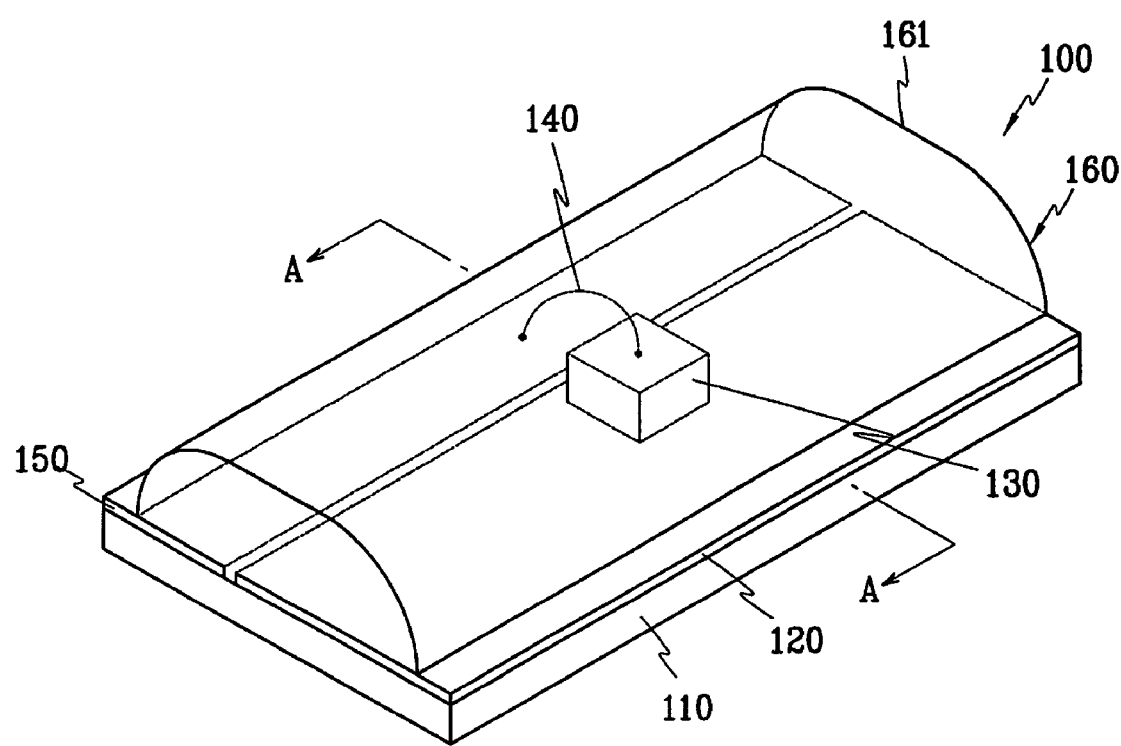
FIG. 2 is a perspective view of a chip light emitting diode according to a first preferred embodiment.
Figure 3:
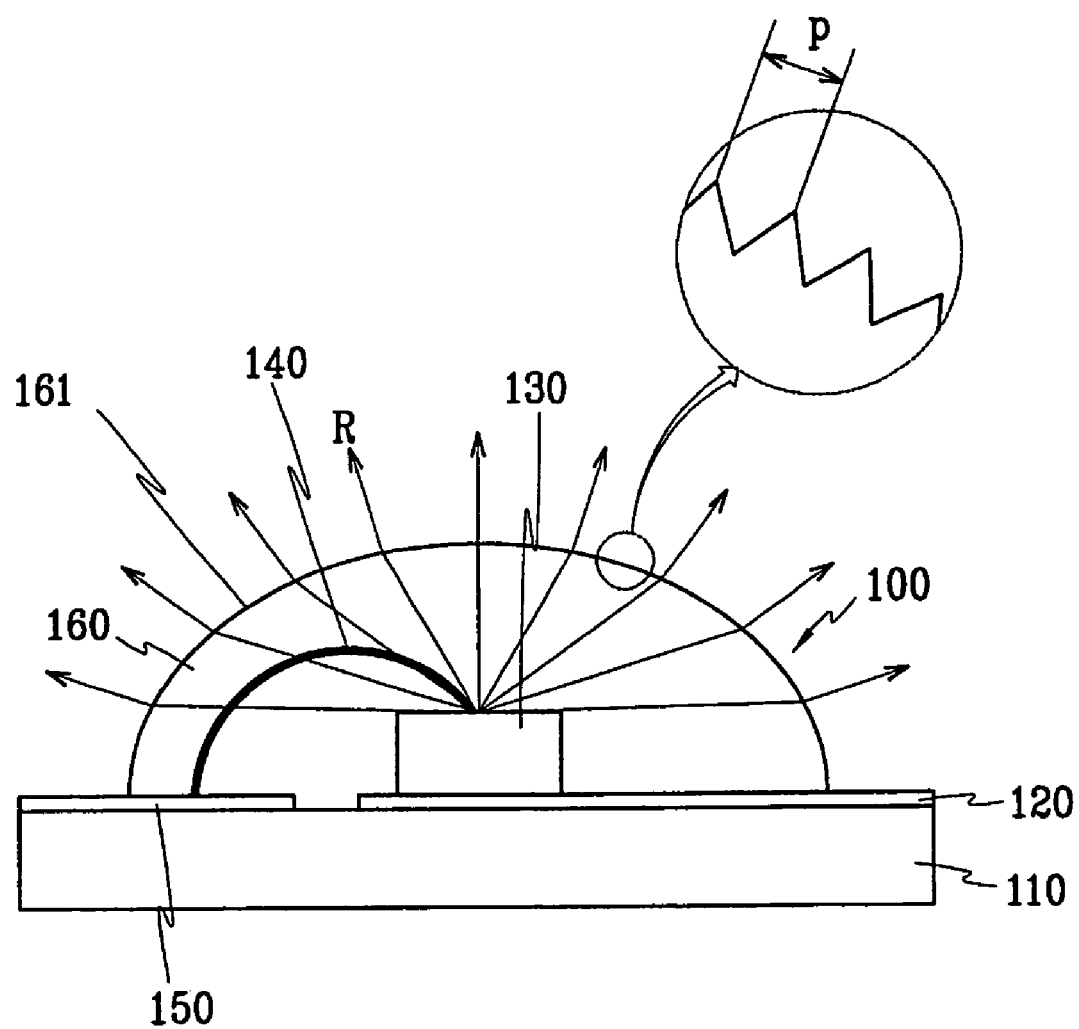
FIG. 3 is an enlarged sectional view taken along lines A—A of FIG. 2.

Referring to FIGS. 2 and 3, a chip light emitting diode (LED) 100 according to a first preferred embodiment of the present invention has a metal pad 120 and a lead 150 provided on a printed circuit board (PCB) 110, and a light emitting chip 130 mounted on the metal pad 120. The metal pad 120 is made of an electrically conductive material, and the chip 130 may be suitably selected from among light emitting chips of wavelengths ranging from infrared to ultraviolet. A wire 140 connects the light emitting chip 130 to the lead 150, and a resin package is formed protruding from the PCB 110 to seal the chip 130 and parts of the lead 150 and metal pad 120.

The resin package 160 has a curved projecting part 161 which has a cross section that is substantially semicircular. The cross section is elongated to form a cylindrical outer surface of the resin package 160. A suitable epoxy resin may be injected and molded into the resin package 160 using a metal mold (not shown) with a curved cavity.

Light rays R emitted by the chip 130 are refracted on the gently curved surface with different refractive angles. This causes light intensity distribution to become uniform and the viewing angle to be wide.

As shown in the enlarged sectional view of FIG. 3, the surface of the resin package 160 may have fine striations to scatter light emitted from the chip 130. The striations may be formed with a triangular shape, a sinusoidal wave shape, or another suitable shape. The period p of the striations preferably ranges from about 0.5 µm to 1.0 µm. The striations may scatter the light emitted by the chip 130 during refraction on the surface of the resin package 160 to further widen the viewing angle.

Figure 4A:
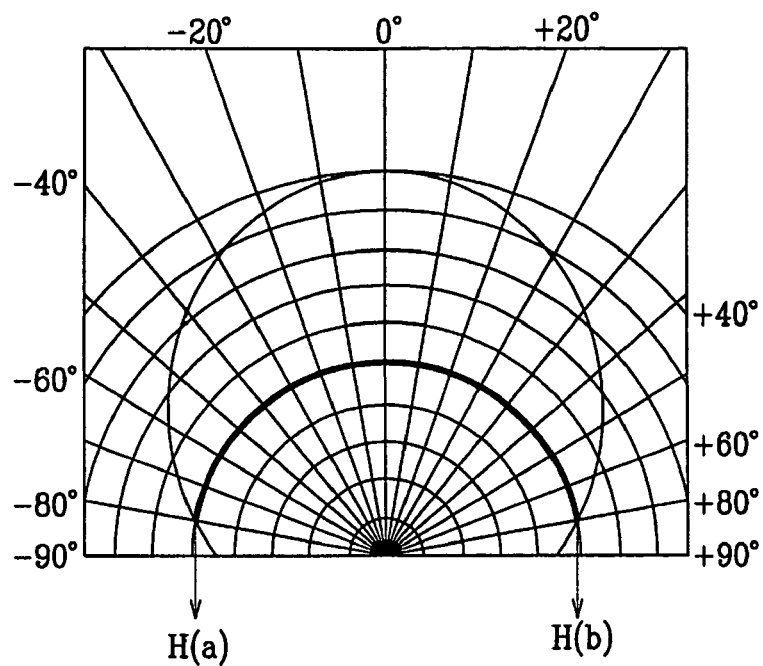
FIGS. 4a and 4b shows characteristics of viewing angle according to the chips of FIG. 2 and FIG. 1, respectively.
Figure 4B:
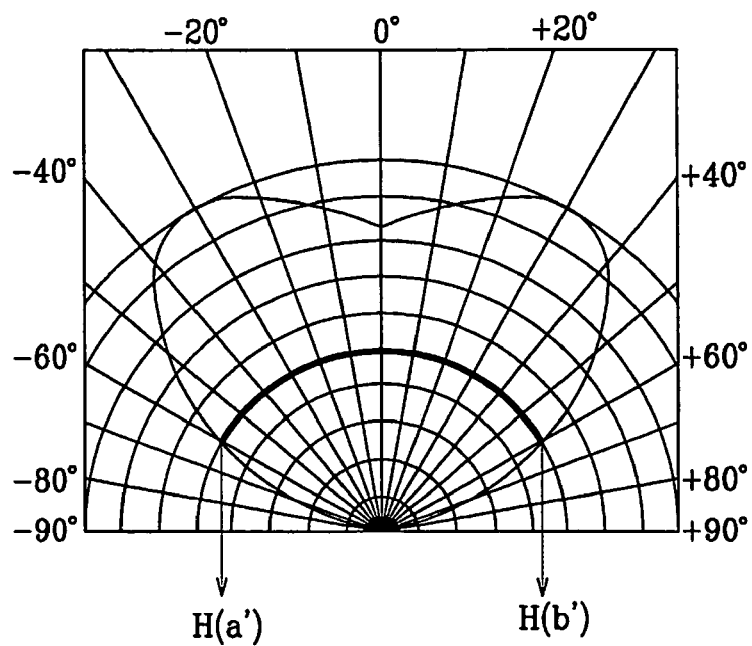

As shown in FIGS. 4A and 4B, in which the viewing angles of the chip LED 100 according to the present invention and the conventional chip LED 50 are respectively shown, the chip LED 100 has a viewing angle ranging about 160° from H(a) to H(b) shown in a bold line, while the conventional chip LED 50 has a viewing angle ranging about 120° from H(a') to H(b'), under the same experimental conditions. Therefore, it is noted that the viewing angle of the chip LED 100 according to the present invention is enhanced by about 400 with respect to the conventional chip LED 50

The resin package 160 of the chip LED 100 has no sharp edge, but rather it has a gently curved surface without limitation of the light path. This causes the light efficiency to be increased, as confirmed by experimental results shown in TABLE 1 which were obtained by the inventors through many experiments. TABLE 1 shows only average values of the light intensity and brightness according to the chip LED 100 and the conventional chip LED 50.

TABLE 1

|  | Average light intensity (mcd) | Average Brightness (cd/m²) |
|---|---|---|
| Chip LED according to the first preferred embodiment | 26 | 980 |
| Conventional chip LED | 20 | 700 |

The experimental results of TABLE 1 were measured under the condition that the light emitting chips 100, 50 had the same dimensions of 304 µm in width, 304 µm in depth, and 100 µm in height, and input currents of 5 mA in light intensity measurement and 15 mA in brightness measurement.

Referring to TABLE 1, the chip LED 100 according to the present invention is enhanced in light intensity by 6 mcd and in brightness by 280 cd/m' on average with respect to the conventional chip LED 50. Therefore, it is noted that the chip LED 100 has more light efficiency than the conventional one.

Figure 5:
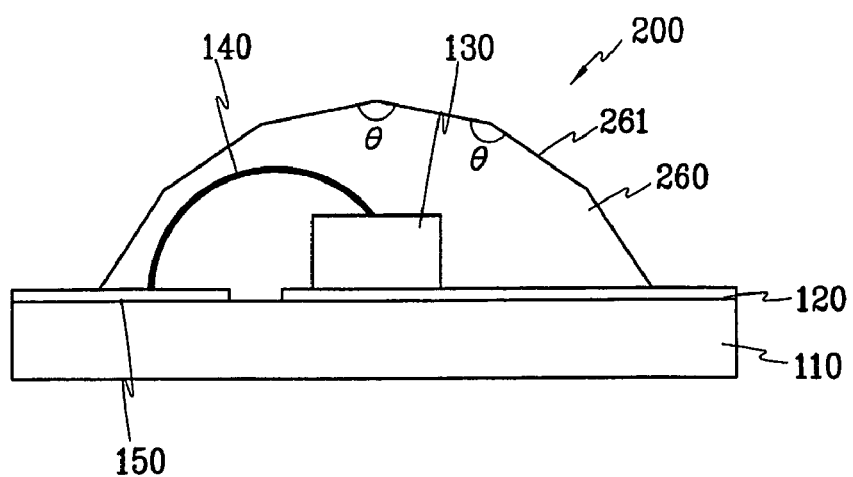
FIGS. 5 to 7 show other examples of the resin package in the chip light emitting diodes according to the first preferred embodiment.
Figure 6:
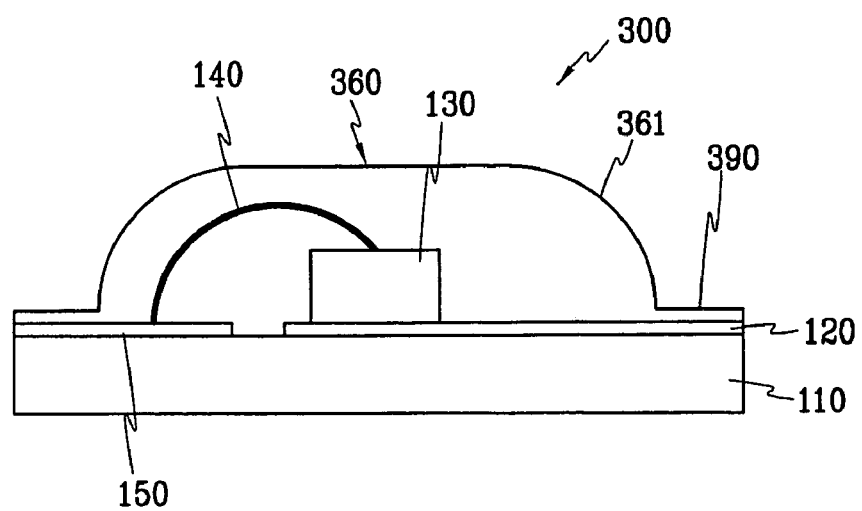
Figure 7:
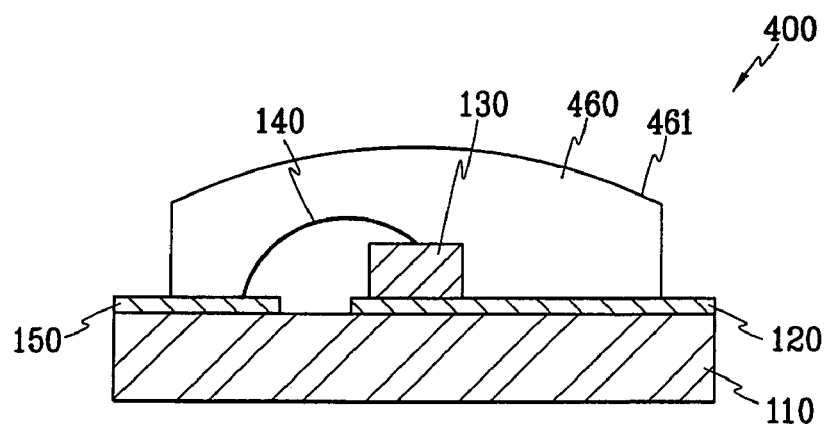

The curved projecting part 161 of the resin package 160 is described having a cross section of a semicircle referring to FIGS. 2 and 3, but it is not limited thereto. The cross section of the curved projecting part 161 may be variably modified. FIGS. 5 to 7 shows examples of chip LEDs having resin packages of various cross sections.

Referring now to FIG. 5, the chip LED 200 has a resin package 260. The resin package 260 has a curved projecting part 261 which has a cross section that is substantially semicircular, similar to that of FIG. 2 or FIG. 3. Further, the cross section of the curved projecting part 261 is comprised of a plurality of straight lines with an angle θ formed between adjacent lines. The angle θ may be the same over the entire curvature, or different depending on location. The cross section is elongated to form a cylindrical outer surface of the resin package 260. The resin package 260 may serve a similar function as the resin package 160 according to the first preferred embodiment.

Referring to FIG. 6, a resin package 360 of a chip LED 300 has a stepped part 390 along edges on the elongated sides. The resin package 360 has a curved projecting part 361 to serve a similar function as the resin package 160 according to the first preferred embodiment. Although one stepped part is formed on each side in FIG. 6, it is possible to provide two or more stepped parts on each side as necessary.

It is also possible to provide a chip LED 400 with a resin package 460, as shown in FIG. 7, whose upper surface is curved while side surfaces thereof are flat.

The present invention is not limited to the above-described embodiments. A curved projecting part of the resin package may have a cross section that is partly elliptical, parabolic, or circular, or any modification thereof. A surface of the resin package may have fine striations to scatter light, resulting in further widening of the range of viewing angle.

The resin package according to the present invention may be easily adapted to chip LEDs having a two-top structure.

Figure 8:
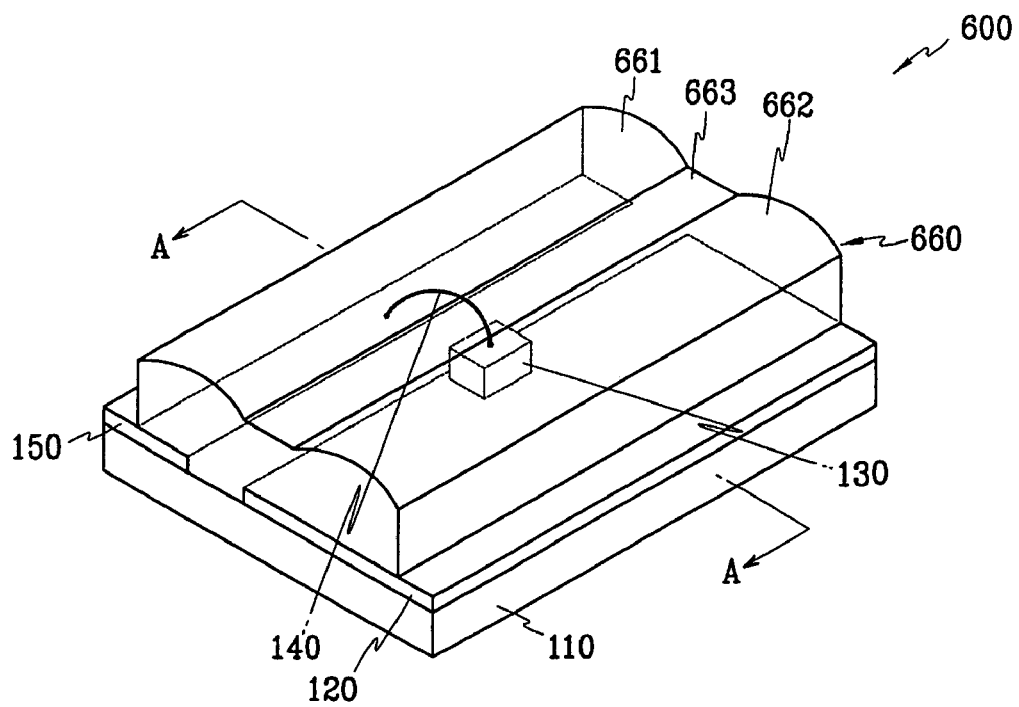
FIG. 8 is a perspective view of a chip light emitting diode according to a second preferred embodiment.
Figure 9:
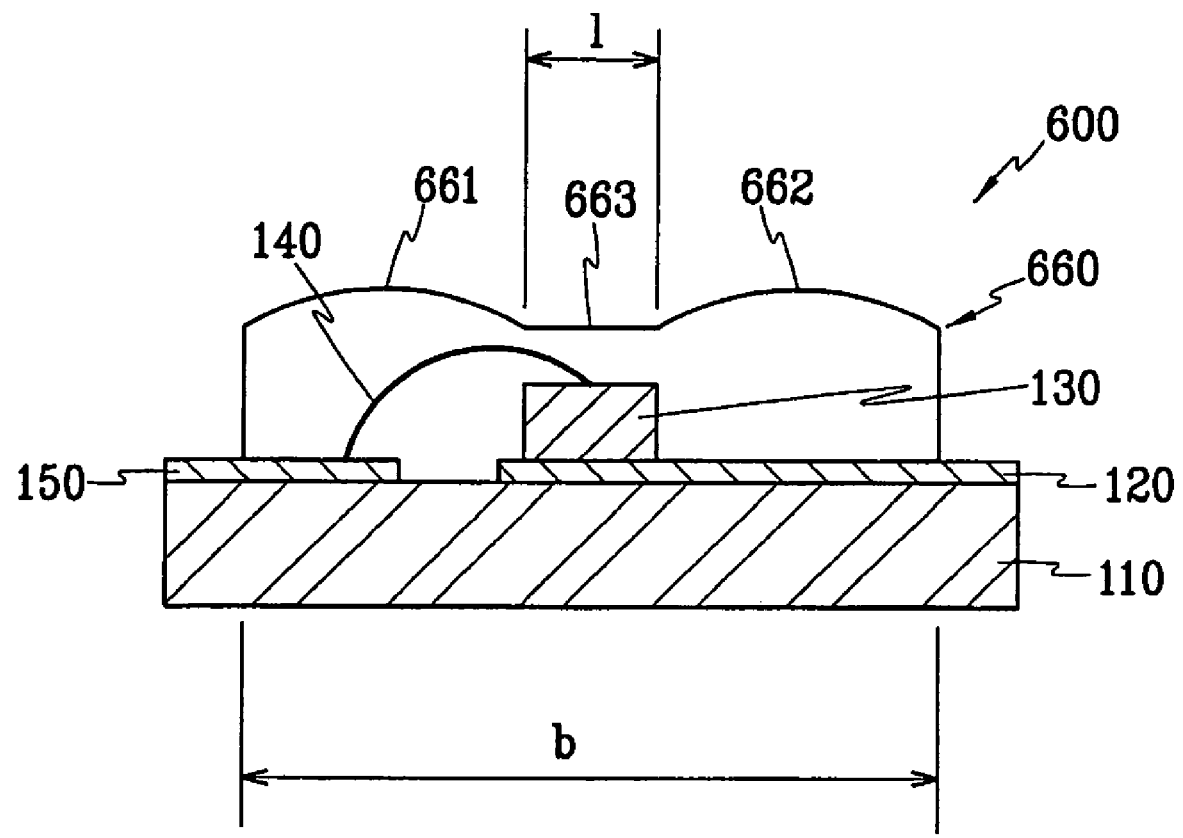
FIG. 9 is a sectional view along lines A—A of FIG. 8.

Referring next to FIGS. 8 and 9, a chip LED 600 according to a second preferred embodiment of the present invention will be described. The chip LED 600 is similar to the chip LED 100 according to the first preferred embodiment, except the shape of a resin package 660.

The resin package 660 of the chip LED 600 has two curved projecting parts 661, 662. Both curved projecting parts 661, 662 are spaced out by spacer 663 with an interval l therebetween. The interval l may be selected from a range of 0.1 to 0.4 times the bottom length b in the cross section.

In the chip LED 600 according to the second preferred embodiment, light rays emitted by the chip 130 are transmitted and refracted on the two curved surface of the projecting parts 661 and 662. Then, the refracted rays diverge to provide a large viewing angle. This may enhance the lighting effect of both sides on a predetermined area.

Although the resin package 660 of the chip LED 600 according to the second preferred embodiment is described to have two projecting parts 661, 662, it is also possible to form more than two projecting parts in a resin package.

Figure 10:
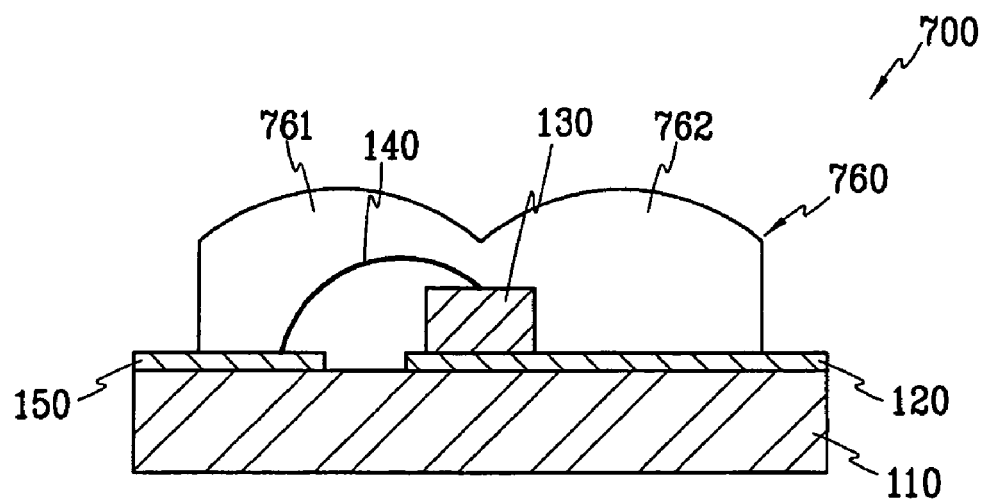
FIGS. 10 and 11 show other examples of the resin package in the chip light emitting diodes according to the second preferred embodiment.
Figure 11:
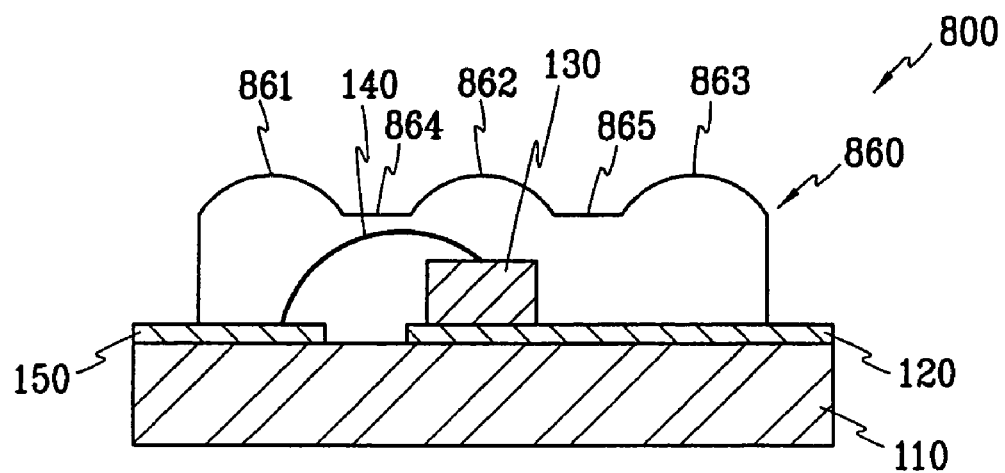

FIGS. 10 and 11 show other examples of the resin package. A chip LED 700 of FIG. 10 has a resin package 760 with two projecting parts 761, 762 which are formed adjacent to each other without any spacer. A chip LED 800 having a resin package 860 is shown in FIG. 11. Three projecting parts 861, 862, 863 are formed with two spacers 864, 865.

Figure 1:
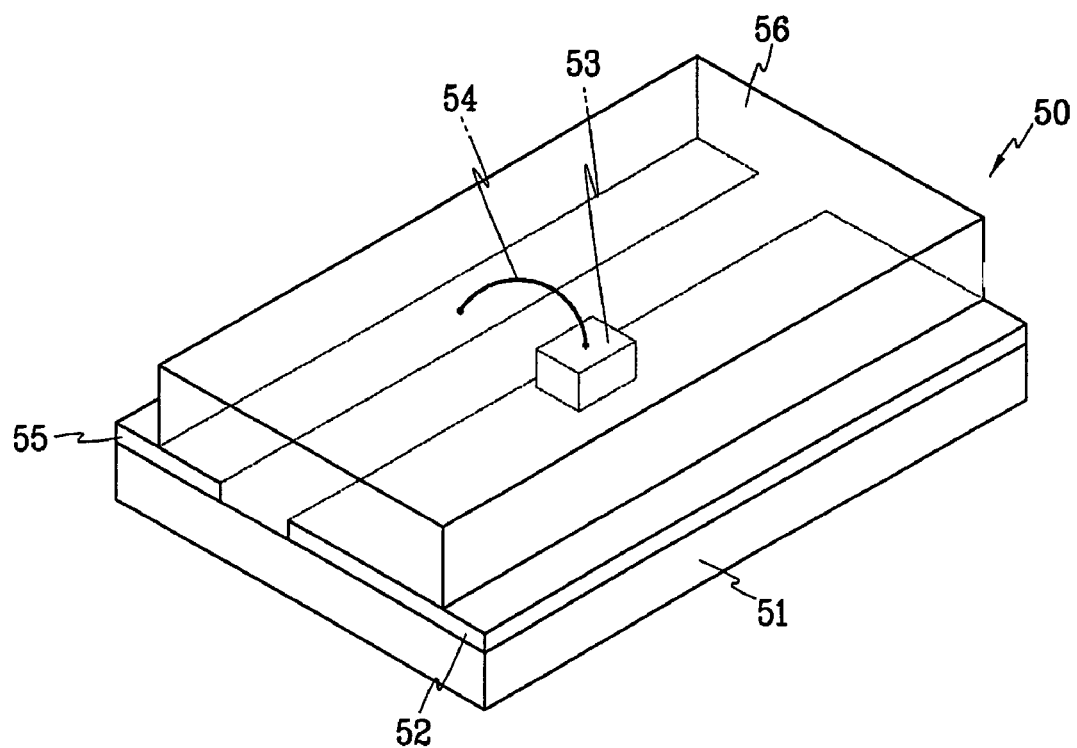
FIG. 1 is a perspective view of a conventional chip light emitting diode.

Light rays emitted by the chip 130 in the chip LED 700 or 800 are transmitted and refracted in the projecting parts 661, and they diverge with a large viewing angle. This may enhance the lighting effect as compared to the conventional chip LED 50 in FIG. 1.

It is also possible that the surface of the resin package according to the second preferred embodiment may have fine striations to scatter light, resulting in further widening of the range of viewing angle.

Figure 12:
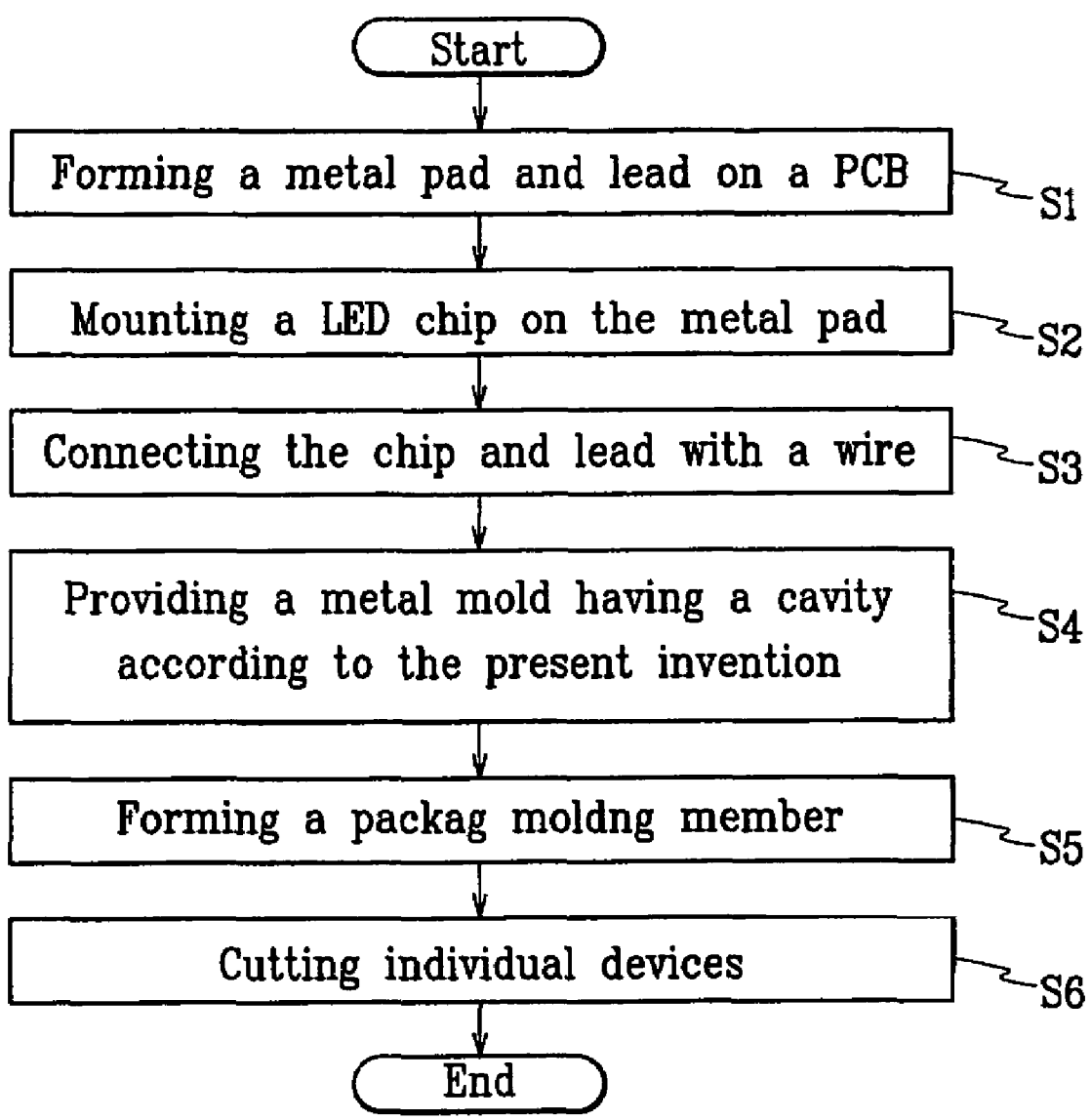
FIG. 12 shows a flow chart illustrating a fabricating method of a chip light emitting diode according to the present invention.

Referring next to FIG. 12 with FIG. 2, a fabrication method of a chip LED will be described. First, the metal pad 120 and lead 150 are formed on the PCB 110 (S1). The chip 130 is mounted on the metal pad 120 and then connected to the lead 150 with the wire 140 (S2–S3). The chip 130 may be suitably selected from among light emitting chips of a desired wavelength.

The PCB 110 is then mounted on a mold having a cavity (S4). The cavity corresponds to the projecting part(s) according to one of the first preferred embodiment and the second preferred embodiment.

Next, a solid epoxy mold compound is heated to 170-1800 and injected into the mold. The resin package 160 is formed on the PCB 110 with the shape described in the first or second preferred embodiment (S5). The resin package is formed to seal the light emitting chip. It is possible that the resin package is formed to seal either a part of the metal pad and lead, or the entire surface of the metal pad and lead.

Practically, a plurality of chip LEDs are formed on one PCB, which for example has a size of about 80 mm×50 mm. Therefore, each chip LED on the PCB is individually cut off (S6).

As described above, light rays emitted from the light emitting chip diverge radially and uniformly in a chip LED according to the present invention, to further widen the viewing angle. The lighting efficiency of the chip LED is also improved, so the number of chip LEDs is reduced in application to backlighting to light a certain area.

Heat generated from the chip LED according to the present invention is also uniformly distributed on the surface, to prevent the chip LED from deforming thermally or mechanically. Further, stress is not concentrated on one side, to enhance the adhesive characteristics between the resin package and the PCB, especially in compact chip LEDs.

Since a mold with a curved projecting part is easily manufactured, as compared to a resin package with a rectangular cross section, a relatively simple mold structure for a resin package reduces fabrication costs.

It will be apparent to those skilled in the art that various modifications and variations can be made to the device and method of the present invention without departing from the spirit and scope of the invention. The present invention covers the modifications and variations of this invention provided they come within the scope of the appended claims and their equivalents.

What is claimed is:

1. A chip light emitting diode comprising:
   a metal pad and a lead spaced away from each other on a printed circuit board;
   a light emitting chip mounted on the metal pad;
   a wire connecting the light emitting chip and the lead; and
   a resin package sealing the light emitting chip and at least a part of the metal pad, lead, and the wire, the resin package having at least one curved projecting part, the at least one curved projecting part having a cross section elongated along the printed circuit board,
   wherein the cross section of the curved projecting part is comprised of a plurality of straight lines with an angle formed between adjacent lines.

2. A chip light emitting diode as recited in claim 1, wherein the cross section of the curved projecting part is substantially semicircular, or substantially or partially elliptical or parabolic.

3. A chip light emitting diode as recited in claim 1, wherein at least one stepped part is formed at an outer edge of the resin package.

4. A chip light emitting diode as recited in claim 1, wherein the surface of the resin package has fine striations to scattering light emitted from the light emitting chip.

5. A chip light emitting diode as recited in claim 1, wherein the resin package has one projecting part.

6. A chip light emitting diode as recited in claim 1, wherein the resin package has two projecting parts which are spaced away from each other by a predetermined interval, wherein the predetermined interval ranges from 0.1 to 0.4 times a bottom length of the resin package.

* * * * *